United States Patent [19]

Levien et al.

[11] Patent Number: 4,758,830

[45] Date of Patent: Jul. 19, 1988

[54] SWITCH/DISPLAY UNITS

[75] Inventors: David A. Levien, Sawston; Michael A. Pym, Stampleford; William R. Graham, Sawston; Peter J. F. Smith, West Moors, all of England

[73] Assignees: TI Corporate Services Limited, Birmingham; Phosphor Products Co. Limited, Dorset, both of England

[21] Appl. No.: 727,425

[22] Filed: Apr. 26, 1985

Related U.S. Application Data

[63] Continuation-in-part of Ser. No. 664,548, Oct. 25, 1984.

[51] Int. Cl.$^4$ ............................................. G09G 1/00
[52] U.S. Cl. ................................. 340/712; 340/365 C; 178/18
[58] Field of Search ............ 340/712, 711, 706, 365 C, 340/365 P, 365 R; 178/18, 17 C

[56] References Cited

U.S. PATENT DOCUMENTS

| | | | |
|---|---|---|---|
| 3,971,013 | 7/1976 | Challoner et al. | 340/712 |
| 4,224,615 | 9/1980 | Penz | 340/712 |
| 4,230,967 | 10/1980 | Holz et al. | 340/365 C |
| 4,334,219 | 6/1982 | Paülus et al. | |
| 4,371,870 | 2/1983 | Biferno | 340/365 VL |
| 4,543,564 | 9/1985 | Audin et al. | |
| 4,562,433 | 12/1985 | Biferno | 340/716 |
| 4,567,480 | 1/1986 | Blanchard | 340/36 SP |

FOREIGN PATENT DOCUMENTS

| | | |
|---|---|---|
| 0015438 | 9/1980 | European Pat. Off. . |
| 0054306 | 6/1982 | European Pat. Off. . |
| 1918401 | 10/1970 | Fed. Rep. of Germany . |
| 3004461 | 8/1981 | Fed. Rep. of Germany . |
| 3105103 | 1/1982 | Fed. Rep. of Germany . |
| 2503494 | 4/1981 | France . |
| 2503493 | 4/1981 | France . |
| 1385114 | 2/1975 | United Kingdom . |
| 1520899 | 8/1978 | United Kingdom . |
| 1553563 | 10/1979 | United Kingdom . |
| 2002522 | 11/1979 | United Kingdom . |
| 2072389 | 9/1981 | United Kingdom . |
| 2057657 | 12/1982 | United Kingdom . |
| 2101329 | 1/1983 | United Kingdom . |
| 2105517 | 3/1983 | United Kingdom . |
| 2111689 | 7/1983 | United Kingdom . |
| 2090979 | 7/1985 | United Kingdom . |

OTHER PUBLICATIONS

"Transflex", Sierracin/Intrex Products, 1979.

Primary Examiner—John W. Caldwell, Sr.
Assistant Examiner—Mahmoud Fatahi-Yar
Attorney, Agent, or Firm—Solon B. Kemon

[57] ABSTRACT

A switch/display unit comprises a dot matrix display, having two sets of elongate electrodes, one set being inclined to the other, these sets being applied to opposite sides of a display medium. A transparent dielectric panel is superimposed in front of the display, so that the first set of electrodes, which are formed from a transparent conductive material abut the rear surface of the dielectric panel. A transparent conductive layer is formed in front of the dielectric panel, so that it will capacitively couple electrodes of the first set of electrodes with other electrodes of the first set of electrodes or other electrodes on the rear surface of the dielectric panel. This capacitive coupling may be varied by touching or moving the conductive layer. By applying read pulses to one of the sets of electrodes that are capacitively coupled via the conductive coating and sensing the pulses transmitted to the other electrodes, actuation of the switch can be detected. Circuitry is also provided to apply display control pulses to the first and second sets of the elongate electrodes, so as to provide a display which may change in response to actuation of the switch. Several such switch/display units may be combined into an array, utilizing a common dielectric panel and other components.

21 Claims, 4 Drawing Sheets

SWITCH/DISPLAY UNITS

This application is continuation in part of the copending application No. 664,548 filed 10/25/84.

The present invention relates to combined switch and display units which will hereinafter be referred to as switch/display units.

British Patent Specification No. 2002522 discloses a touch switch with integral electro-luminescent display. This switch may be arranged so that the switch, or a legend on the switch, is illuminated upon actuation of the switch. The illuminated area of the switch is defined by an insulating mask which controls the area of excitation of a layer of phosphor. The area that may be illuminated would therefore be fixed when the switch is manufactured and the switch is consequently suitable to control only one function. The present invention provides a switch/display unit in which the display may be varied electronically, thus providing a programmable multi-function switch.

According to one aspect of the present invention, a switch/display unit comprises; a transparent dielectric panel; a first set of elongate electrodes formed from transparent conductive material on the rear surface of said dielectric panel; a display medium disposed between said first set of electrodes and a second set of elongate electrodes, said electrodes of the first set overlapping those of the second set to form a matrix of dots, each dot defined by the intersection of a unique pair of electrodes, one from the first set and one from the second set, and a transparent conductive layer formed in front of the dielectric panel and overlying the first set of electrodes.

The conductive layer in front of the dielectric panel may be formed on the front surface of the panel with this form of construction, the conductive layer will capacitively couple the electrodes on the rear surface of the panel. This capacitive coupling may be modified by applying an electrical load to the conductive layer by, for example, touching or earthing the conductive layer, and this change in coupling may be used to produce a signal for switching purposes. Alternatively, the conductive layer may be spaced from the front surface of the dielectric panel, but arranged so that it may be moved into engagement with the panel. With this arrangement, initially electrodes on the rear surface of the panel will not be coupled capacitively to any great extent, but will be coupled when the conductive layer is moved into contact with the panel. Again this change in coupling may be used to produce a signal for switching purposes.

For switching purposes, the first set of electrodes may be divided into two groups. Read pulses may be applied to one of these groups of electrodes by means of suitable circuitry. The other group of electrodes may be connected to circuity capable of sensing the change in signal on this group of electrodes, due to the change in capacitive coupling between the groups of electrodes when the switch is actuated, and initiating a switching action in respect to that change. Alternatively, additional electrodes may be provided on the rear surface of the dielectric panel to take over the function of one or the other of the groups of electrodes, so that for example read pulses may be applied to the whole set of electrodes on the rear face of the dielectric panel and a separate electrode may be used for sensing purposes.

The display medium used will be a material which will react to an electric field which may be established between the electrodes of the first set and those of the second set to provide a visual change. Such display media include layers of phosphor, liquid crystals, ionizable gases, electrochromatic materials and electrophoretic materials.

For display purposes, pulses of one polarity are applied to one or more of the electrodes of the first set of electrodes and pulses of opposite polarity are applied to one or more of the electrodes in the second set of electrodes. Where a pulsed electrode of the first set overlies a pulsed electrode of the second set, a potential is applied across the intermediate display medium sufficient to excite the display medium and cause a visual change at that point. The required symbol or legend may thus be built up from dots defined by the intersection of electrodes, by pulsing the appropriate electrodes in each set of electrodes. Typically the first and second sets of elongate electrodes may contain between 20 and 40 electrodes per centimeter.

The read pulses that are applied to the electrodes for switching purposes, may typically be as low as 10 volts and may be of either polarity. It is however convenient to use the same circuitry for applying the read pulses and the display control pulses to the set of the electrodes on the rear face of the dielectric panel. The read pulses are applied at intervals between display control pulses. For example, with a DC electroluminescent display where the display medium is a layer of phosphor the minimum potential difference required to cause the phosphor layer to luminesce is, typically from 80 to 120 volts. Illumination pulses of from $+40$ to $+60$ volts are consequently applied to the appropriate electrodes of one set of electrodes and pulses of from $-40$ to $-60$ volts applied to the appropriate electrodes of the other set of electrodes. These pulses would typically be of 10 to 30 microsecond duration at a frequency of from 0.5 to 2 kHz. Read pulses of the same amplitude as the illumination pulses (i.e. $+40$ to $+60$ volts) would be applied to all the electrodes of the first set of electrodes or group of the first set of electrodes, between the illumination pulses. These pulses would typically be of 10 microsecond duration at a frequency of 500 Hz.

Various embodiments of the invention are now described, by way of example only, with reference to the accompanying drawings, in which.

Figure 1:
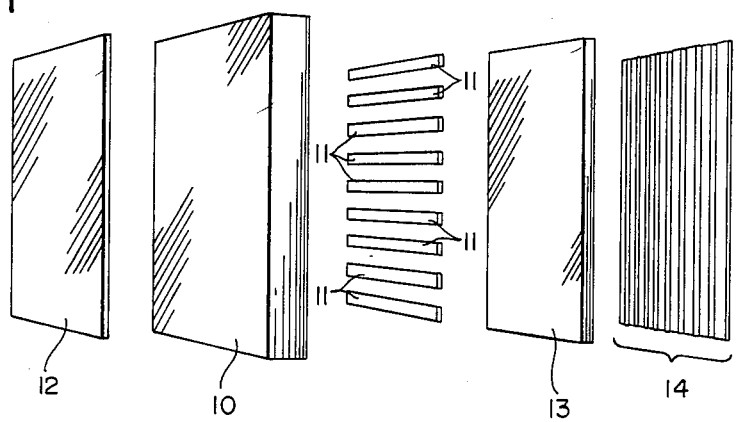
FIG. 1 illustrates diagrammatrically in exploded view, a switch/display unit formed in accordance with the present invention.
Figure 2:
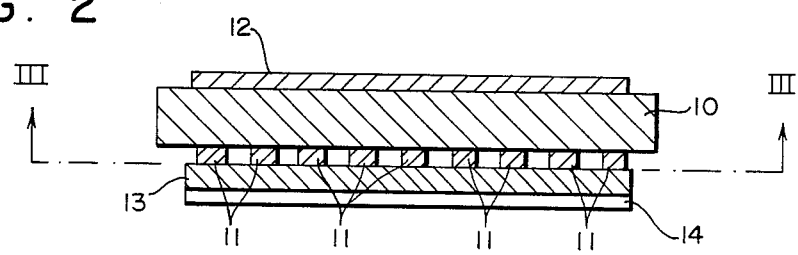
FIG. 2 shows a sectional side elevation of the switch/display unit illustrated in FIG. 1.
Figure 3:
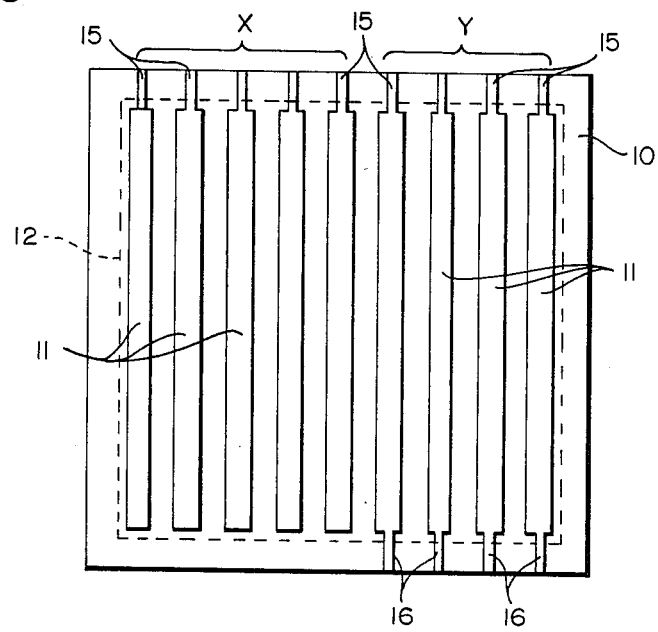
FIG. 3 shows a sectional view along the line III—III shown in FIG. 2.

The switch/display unit illustrated in FIGS. 1 to 3 comprises a panel 10 made of transparent dielectric material, for example glass. A set of transparent elongate parallel electrodes 11, made from electrically conductive material such as tin oxide, are applied to the rear surface of the panel 10. A transparent layer 12 of conductive material is applied to the front surface of panel 10, so that it overlies the set of electrodes 11 on the rear surface of the panel 10.

A layer of phosphor 13 is applied to the rear of the set of electrodes 11 and a second set of elongate parallel electrodes 14, are applied to the rear surface of the phosphor layer 13. The second set of electrodes 14 are arranged so that they extend at right angles to the first set of electrodes 11, each electrode of one set thus overlapping all the electrodes of the other set, to form a dot matrix.

As illustrated in FIG. 3, electrodes 11 are provided with input connections 15 which may be connected to circuitry suitable for applying a voltage pulse individually to each electrode. Electrodes 14 are provided with similar input connections (not shown) by which they may be connected to circuitry for applying a voltage pulse of opposite polarity to those applied to electrodes 11, individually to each electrode 14. Typically, the phosphor layer used will have an illumination threshold of from 80 to 120 volts and the voltage pulse applied to electrodes 11 may be from 40 to 60 volts while the pulses applied to electrodes 14 may be from −40 to −60 volts.

If pulses are applied to one electrode in each of the sets 11 and 14, a potential of from 80 to 120 volts will be applied across the layer 13 of phosphor, at the point where those electrodes 11 and 14 overlap. This potential will excite that portion of the phosphor layer 13 and produce an illuminated dot. By applying pulses simultaneously to the appropriate electrodes in each set of electrodes 11 and 14, the plurality of dots may be illuminated to form a legend or symbol. The legend or symbol may be altered by applying pulses to different electrodes in the sets 11 and 14. Typically, these illumination pulses will have a duration of from 10 to 30 microseconds and be applied to the electrodes at a frequency of 0.5 to 2 kHz, while the display is illuminated.

To provide switch means the set of electrodes 11 are divided into two groups X and Y, as shown in FIG. 3. The group Y is provided with a set of output connections 16 by which they may be connected to suitable sensing circuitry. Read pulses may now be applied simultaneously to all the electrodes 11 in group X and these will be coupled capacitively, via the conductive layer 12, to the electrodes 11 in group Y and an output pulse will consequently be transmitted to the electrodes 11 in group Y. This output pulse may be detected by the sensing circuit. To actuate the switch, an electrical load is applied to the conductive layer 12 by, for example, a person touching the conductive layer 12. This load will reduce the capacitive coupling between groups X and Y of the set of electrodes 11 and will thus reduce the signal on the electrodes 11 in group Y. This reduction in signal may be detected by the sensing circuit and used to effect switching.

For convenience, the circuitry to apply illumination pulses to electrodes 11, may also be used to apply the read pulses, but instead of pulsing individual electrodes 11 as required for illumination purposes, it will be arranged to pulse all the electrodes 11 in group X simultaneously. These read pulses will be applied in between the illumination pulses and will typically be of the order of 10 microsecond duration at a frequency of 500 Hz. As no pulse will be applied to the electrodes 14 when the read pulses are applied to the electrodes 11, the potential across the phosphor layer will not reach the illumination threshold and consequently the display will not be affected The switch/display unit described above provides a display which may be varied as desired. The switch may consequently be used as a programmable multifunctional switch, the display being arranged to change in response to actuation of the switch or in response to actuation of other switches in, for example, an array of similar switch/display units.

Figure 4:
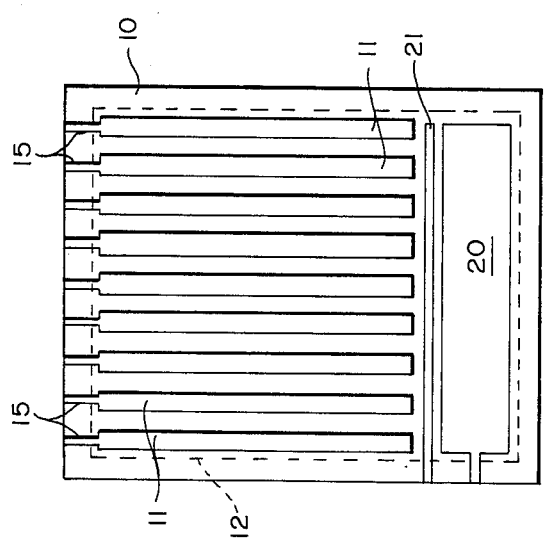
FIG. 4 shows a view similar to that shown in FIG. 3, illustrating a modified switch/display unit.

Instead of dividing the set of electrodes 11 into two groups X and Y as described above, an additional electrode 20 may be provided on the rear surface of panel 10 as illustrated in FIG. 4. The phosphor layer 13 and second set of parallel electrodes 14 are applied to the rear of the first set of electrodes 11 and the display is operated in the manner described above.

However, for switching purposes, read pulses are applied simultaneously to all the electrodes 11 in the set. The conductive layer 12 is extended, so that it overlies both the set of electrodes 11 and the electrode 20 and this couples the electrodes 11 to the electrode 20. Electrode 20 is connected to a suitable sensing circuit, so that the change in signal, when a load is applied to the conductive layer 12, can be detected and switching initiated as described above. A further guard electrode 21 is provided on the rear surface of panel 10 between the set of electrodes 11 and electrode 20. This guard electrode 21 is connected to earth so as to minimise direct coupling of the electrodes 11 with electrode 20.

The switch/display units described above may be modified as illustrated in FIG. 5, by positioning a transparent, resilient conductive membrane 40 in front of the conductive layer 12, said membrane 40 being spaced from the conductive layer 12 by means of insulative spacers 41. This modified switch/display unit is actuated by a person depressing the membrane 40 until it comes into contact with the conductive layer 12. The conductive layer 12 will then be connected to earth through the membrane 40 and the person touching the membrane, and the resulting electrical load on the conductive layer 12 will cause a reduction in the capacitive coupling of the switch, in the manner described above. The movement of the membrane 40 will provide a tactile feedback to the person operating the switch. The membrane 40 may be moulded to form a bubble or blister formation over the conductive layer 12, so that when depressed it will move into engagement with the conductive layer with a snap action feel. These bubble or blister formations may also serve to separate the membrane 40 from the conductive layer 12, in place of the spacers 41.

Figure 6:
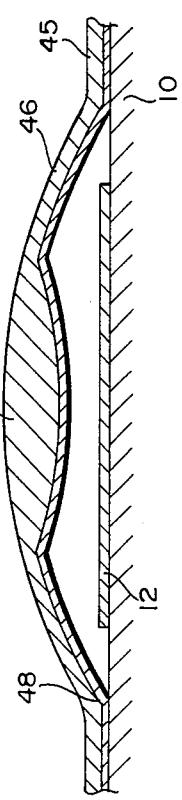

In the switch illustrated in FIG. 6, a membrane 45 is formed from transparent non-conductive resilient plastics material, and is moulded to provide a bubble or blister formation 46 which overlies and is separated from the conductive layer 12. The inner surface of the membrane 45 is provided with a transparent conductive coating 48, this coating 48 being connected to earth. When this switch is actuated by depressing the blister formation 46, the conductive layer 12 is connected directly to earth via coating 48. The resulting change in capacitance will consequently be independent of the person actuating the switch and will give a more consistent change in signal when the switch is actuated. Furthermore, this form of switch may be actuated by non-conductive implements.

When pressure is removed from the blister formation 46 it will snap back away from the conductive layer 12, so that the capacitive characteristics of the switch will revert to their original values when the switch is not actuated.

The central portion of the blister formation 46 may be formed with a lens 47, through which the display will be magnified.

Figure 7:
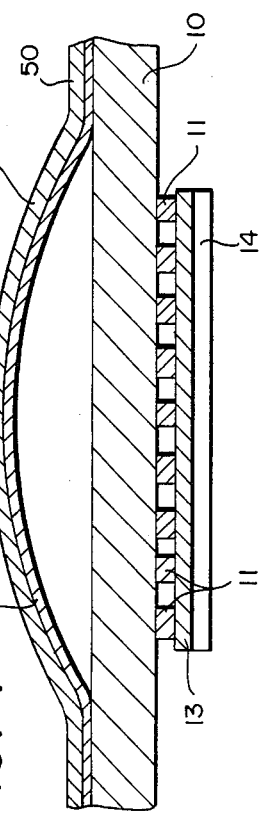
FIG. 7 illustrates diagrammatically in sectional sid elevation a further form of switch/display unit formed in accordance with the present invention.

In the switch/display unit illustrated in FIG. 7, the arrangement of the sets of electrodes 11 and 14 and phosphor layer 13, on the rear of the dielectric panel 10, is the same as that disclosed with reference to FIGS. 1 to 3. However, instead of forming a conductive layer 12 on the front surface of the panel 10, a conductive coating 52 is provided on the rear surface of a blister formation 51 formed in a transparent, resilient non-conductive membrane 50 positioned in front of the panel 10 so that it overlies the set of electrodes 11 and is spaced from the front surface of panel 10. The conductive layer 52 is electrically isolated. With this construction, there will be little or no coupling between the groups X and Y of electrodes 11 when the switch is in its non-actuated condition. Consequently when read pulses are applied to electrodes 11 in group X, there will be no or only a very small output pulse on the electrodes 11 in group Y. However, when the blister formation 51 is depressed so that the coating 52 engages the upper surface of panel 10, the electrodes 11 in groups X and Y will be coupled capacitively through the coating 52. A read pulse applied to the electrodes 11 in group X will now produce an output pulse of significant amplitude on the electrodes 11 in group Y and this pulse may be used to initiate switching.

This form of switch, in which the conductive layer 52 is spaced from the front surface of the dielectric panel 10, may be used with other arrangements of electrodes on the rear surface of the dielectric panel 10, for example, in the form described with reference to FIG. 4.

Figure 8:
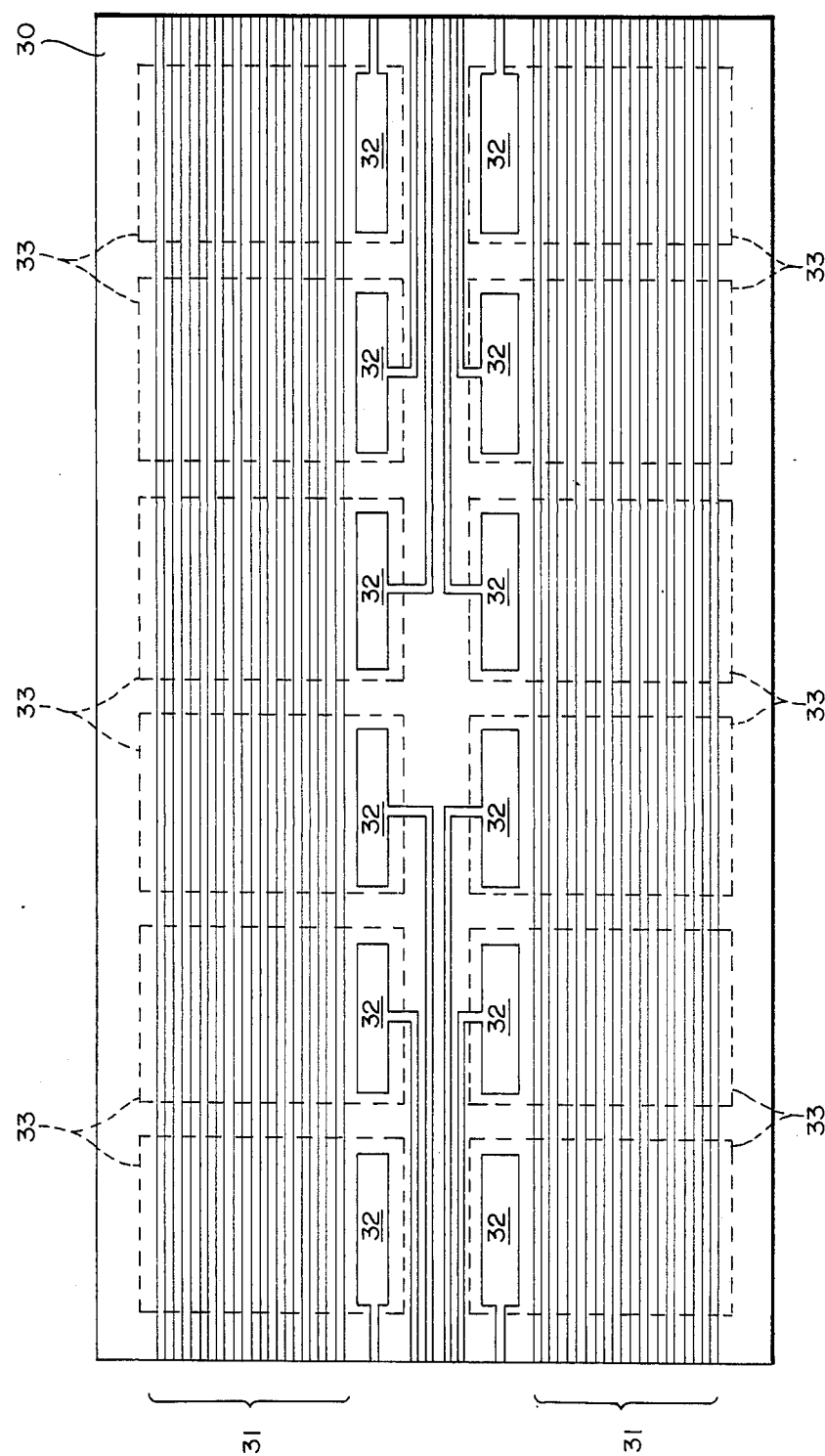
FIG. 8 shows a similar view to that shown in FIGS. 3 and 4, illustrating a 2×6 array of switch/display units formed in accordance with the present invention.

The switches described above may be used individually or several such switches may be used together. However, this form of construction is suitable for producing an array of switch/display units on a single panel, as illustrated in FIG. 8. This FIGURE shows a 2 by 6 array of switch/display units, two rows of six switch/display units being formed on a dielectric panel 30. Two sets of transparent elongate electrodes 31 are provided on the rear face of the panel 30. Two rows of six separate transparent electrodes 32 are also formed on the rear face of the panel 30, between the sets of the electrodes 31. Each set of electrodes 31 is capacitively coupled to the adjacent row of electrodes 32 by means of individual transparent conductive layers 33 formed on the front surface of panel 30. Each conductive layer 33 overlies a different one of the electrodes 32 and a portion of the adjacent set of electrodes 31. As described above, the two sets of electrodes 31 may be connected to circuitry for applying read pulses, while the electrodes 32 may be connected to suitable sensing circuitry. The application of an electrical load to one of the conductive layers 33 will alter the coupling between the set of electrodes 31 and electrode 32 covered by that conductive layer 33 and the change in signal on the electrode 32 can be sensed to effect a switching action appropriate to that switch.

A phosphor layer is applied to the rear surface of the electrodes 31 and 32 and two further sets of parallel elongate electrodes are applied to the rear face of the phosphor layer, in the manner described above. The display means of each switch can thus be controlled by applying pulses to the appropriate electrodes on either side of the phosphor layer, as described with reference to the individual switch/display units.

Similarly, switches of the form described with reference to FIG. 7 may be formed into an array.

Figure 5:
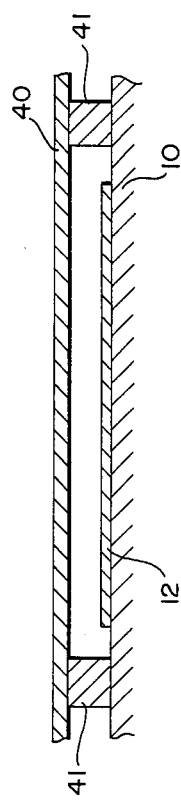
FIGS. 5 and 6 illustrate diagrammatically in sectional side elevation, modifications to the switch/display units illustrated in FIGS. 1 to 4.

The switch/display units of such arrays may be provided with resilient membranes in the manners described with reference to FIGS. 5 to 7. In such arrays the membranes for each switch will preferably be formed as a single sheet, for example as a sheet moulded with individual blister formations 46 or 51 for each switch. Where the membrane has a conductive coating, as described with reference to FIGS. 6 and 7, this too may be formed as a single coating over the whole of the sheet.

Figure 9:
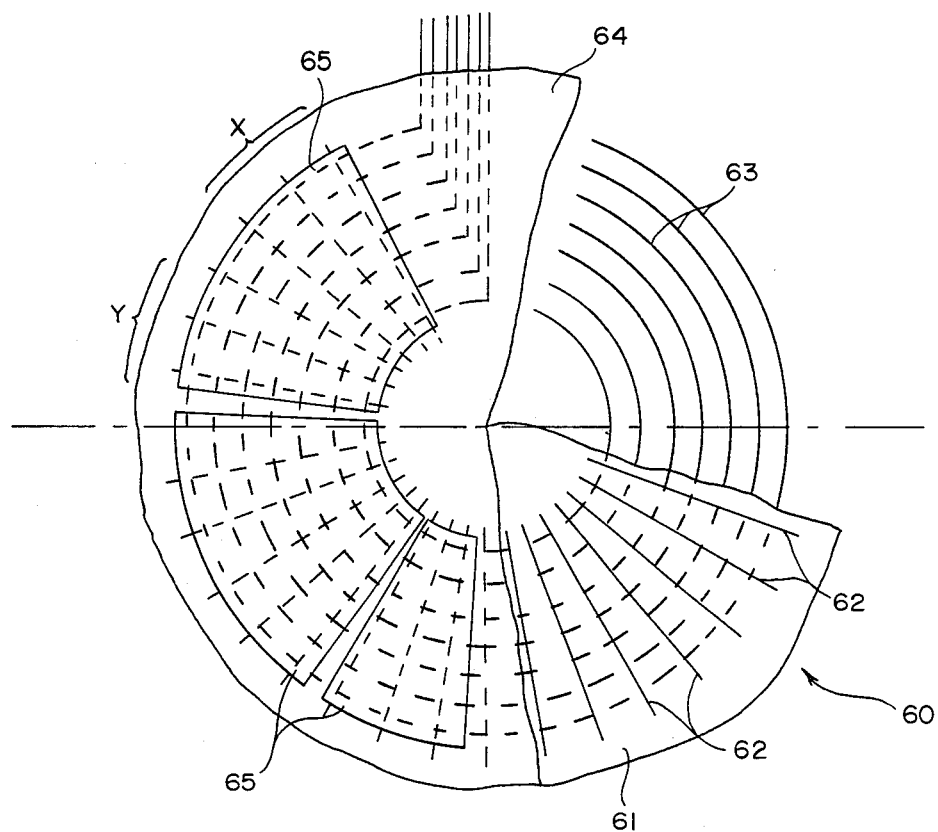
FIG. 9 illustrates diagrammatically in cut away plan view a polar array of switch/display units formed in accordance with the present invention.
Figure 10:
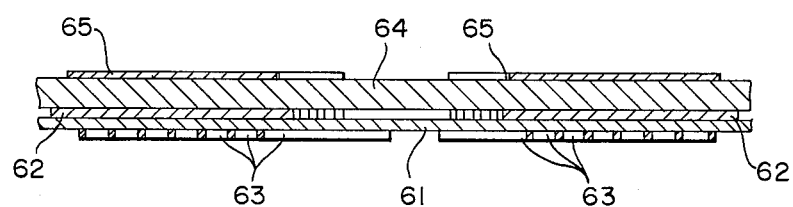
FIG. 10 shows a section through the array illustrated in FIG. 9.

As illustrated by the embodiment shown in FIGS. 9 and 10 the first and second sets of electrodes 62, 63 forming the dot matrix display 60 need not be sets of parallel electrodes and displays other than electroluminescent displays may be used.

As illustrated in FIGS. 9 and 10 the switch/display unit comprises a polar dot matrix liquid crystal display 60. This display 60 has a liquid crystal display medium 61 disposed between a first set of radial electrodes 62 and a second set of concentric annular electrodes 63, each radial electrode 62 intersecting each of the annular electrodes 63. In this manner the intersection of each pair of electrodes 62, 63 sandwiches a unique portion of the liquid crystal 61 and this portion of the liquid crystal 61 may be actuated by applying an electrical potential across the electrodes 62, 63 to form a dot. By energising appropriate pairs of electrodes 62, 63 a symbol or legend may be built up from the dots, as required. As with the electroluminescent displays described hereinbefore, the potential required to actuate the display is achieved by applying display control pulses of opposite polarity, simultaneously to pairs of electrodes 62, 63.

A glass sheet 64 is positioned in front of the radial electrodes 62. A series of transparent conductive pads 65 is formed on the front surface of the glass sheet 64, each conductive pad 65 overlying a different set of the radial electrodes 62.

As with the embodiment described with reference to FIGS. 1, 2 and 3, the radial electrodes 62 underlying each of the conductive pads 65 are divided into two groups X and Y. One of these groups X is connected to means by which read pulses may be applied thereto, while the other group Y is connected to a sensing circuit. Actuation of the switch may then be monitored in the manner described above with reference to FIGS. 1, 2 and 3.

The switch/display unit illustrated in FIGS. 9 and 10 may be modified in similar manner to the switch illustrated in FIG. 4 by replacing one of the groups X or Y of electrodes 62 with an additional electrode. This additional electrode may conveniently be of arcuate form and positioned either internally or externally of the ring of radial electrodes 62 between the display medium 61 and glass sheet 64.

Various modifications may be made without departing from the invention. For example, with the array of switch/display units, the two sets of electrodes 31 on the rear surface of the panel 30 may alternatively be arranged vertically in the manner indicated in FIG. 4. With arrays of switch/display units of the type described above, the units may be multiplexed under the control of a microprocessor, as described in British Patent No. 2059657.

Finally, it should be noted that the accompanying drawings are diagrammatic illustrations only. They are not intended to indicate the relative dimensions and particularly thicknesses of the components. Typically the dielectric panel 10 will be of the order of 3 mm thick; the phosphor layer 13 of the order of 40 microns thick; and the various electrodes 11, 14, 20, 21, 31, 32 and conductive layers 12, 33 of the order of 0.05 microns thick.

We claim:

1. A combined switch and display unit comprising:
   a transparent dielectric panel having front and rear sides;
   a first electrode means formed from transparent conductive material on the rear side of said dielectric panel;
   a display medium disposed on the opposie side of said first electrode means to said dielectric panel;
   a second electrode means disposed on the opposite side of said display medium to said first electrode means;
   a third electrode means formed from transparent conductive material on the rear side of said dielectric panel adjacent said first electrode means, said first and third electrode means providing a switching function and at least said first and second electrode means providing a display function;
   an electrically floating transparent conductive layer formed in front of said dielectric panel and overlying said first and third electrode means for capacitive coupling therebetween, changes in the capacitive coupling provided by said conductive layer providing the switching function between said first and third electrode means; and
   means for connecting at least said first and second electrode means to means for providing display pulses whereby said display medium provides a display in response to an electric field display medium caused by said display pulses on at least said first electrode means and said second electrode means;
   wherein, for a single switch of said unit, said first electrode means comprises a first set of elongate electrodes, said second electrode means comprises a second set of elongate electrodes, said second set of electrodes overlapping at least said first set of electrodes to form a dot matrix, and the display being provided in response to the electric field caused by said display pulses on selectively energized overlapping ones of said first and second sets of electrodes such that the display on the switch can be varied by selective application of said display pulses to said electrodes forming said dot matrix.

2. A combined switch and display unit as claimed in claim 1 in which said third electrode means comprises a third set of elongate electrodes adjacent said first set thereof, one of said first and third sets including means for connecting the electrodes of said one set to means for applying read pulses thereto, and the other of said first and third sets including means for connecting the electrodes of said other set to means for sensing pulses thereon, said second set of electrodes overlapping said first and third sets of electrodes to form the dot matrix, and the display being provided in response to the electric field caused by said display pulses on selectively energized overlapping ones of said first and third sets with said second set of electrodes.

3. A combined switch and display unit as claimed in claim 1 in which said first set of electrodes includes means for connecting the electrodes of said first set to means for applying read pulses thereto, and wherein said third electrode means comprises at least one additional transparent electrode formed on the rear surface of the dielectric panel, said third electrode means including means for connecting said at least one additional electrode to means for sensing pulses thereon.

4. A combined switch and display unit as claimed in claim 3 in which said first set of electrodes and said at least one additional electrode are separated by a guard electrode, said guard electrode including means for connecting said guard electrode to ground.

5. A combined switch and display unit as claimed in claim 1 in which a transparent conductive layer is disposed on the surface of said dielectric panel.

6. A combined switch and display unit as claimed in claim 5 in which a transparent resilient conductive membrane overlies and is spaced from said conductive layer.

7. A combined switch and display unit as claimed in claim 6 in which a transparent resilient non-conductive membrane overlies and is spaced from said conductive layer said membrane having a transparent conductive coating on the surface thereof adjacent to said conductive layer.

8. A combined switch and display unit as claimed in claim 1 in which said transparent conductive layer is spaced from the front surface of said dielectric panel and is movable into contact therewith.

9. A combined switch and display unit as claimed in claim 8 in which said transparent conductive layer is formed on the rear surface of a transparent conductive resilient membrane which overlies and is separated from said dielectric panel.

10. An array of combined switch and display units as claimed in claim 4 in which said third electrode means comprises a third set of elongate electrodes adjacent said first set thereof, one of said first and third sets including means for connecting the electrodes of one set to means for applying read pulses thereto, and the other of said first and third sets including means for connecting the electrodes of said other set to means for sensing pulses thereon, said second set of electrodes overlapping said first and third sets of electrodes to form the dot matrix, and the display being provided in response to the electric field caused by said display pulses on selectively energized overlapping ones of said first and third sets with said second set of electrodes.

11. An array of combined switch and display units, each unit comprising:
    a transparent dielectric panel having front and rear sides;
    a first electrode means formed from transparent conductive material on the rear side of said dielectric panel;
    a display medium disposed on the opposite side of said first electrode means to said dielectric panel;

a second electrode means disposed on the opposite side of said display medium to said first electrode means;

a third electrode means formed from transparent conductive material on the rear side of said dielectric;

an electrically floating transparent conductive layer formed in front of said dielectric panel and overlying said first and third electrode means for capacitive coupling therebetween, changes in the capacitive coupling provided by said conductive layer providing the switching function between said first and third electrode means; and means for connecting at least said first and second electrode means to means for providing display pulses whereby said display medium provides a display in response to an electric field caused by said display pulses on at least said first electrode means and said second electrode means;

wherein, for a single switch of said array, said first electrode means comprises a first set of elongate electrodes, said second electrode means comprises a second set of elongate electrodes, said second set of electrodes overlapping at least said first set of electrodes to form a dot matrix, and the display being provided in response to the electric field caused by said display pulses on selectively energized overlapping ones of said first and said second sets of electrodes such that the display on each switch can be varied by selective application of said display pulses to said electrodes forming said dot matrix, and wherein all of said units are formed in spaced relationships, on a common transparent dielectric panel.

12. An array of combined switch and display units as claimed in claim 11 in which said first set of elongate electrodes are common to a plurality of said units.

13. An array of combined switch and display units as claimed in claim 11, in which said first set of electrodes includes means for connecting the electrodes of said first set to means for applying read pulses thereto, and wherein said third electrode means comprises at least one additional transparent electrode formed on the rear surface of the dielectric panel, said third electrode means including means for connecting said at least one additional electrode to means for sensing pulses thereon.

14. A combined switch and display unit assembly comprising:

a combined switch and display unit having a transparent dielectric panel with front and rear sides;

a first electrode means formed from transparent conductive material on the rear site of said dielectric panel;

a display medium disposed on the opposite side of said first electrode means to said dielectric panel;

a second electrode means disposed on the opposite side of said display medium to said first electrode means;

a third electrode means formed from transparent conductive material on the rear side of said dielectric panel adjacent said first electrode means, asid first and third electrode means providing a switching function and at least said first and second electrode means providing a display function;

an electrically floating transparent conductive layer formed in front of said dielectric panel and overlying said first and third electrode means for capacitive coupling therebetween, changes in the capacitive coupling provided by said conductive layer providing the switching function between said first and third electrode means; and means for connecting at least said first and third electrode means to means for providing display pulses whereby said display medium provides a display in response to an electric field caused by said display pulses on at least said first electrode means and said second electrode means;

wherein, for a single switch of said unit, said first electrode means comprises a first set of elongate electrodes, said second electrode means comprises a second set of elongate electrodes, said second set of electrodes overlapping at least said first set of electrodes to form a dot matrix, and the display being provided in response to the electric field caused by said display pulses on selectively energized overlapping ones of said first and said second sets of electrodes such that the display on the switch can be varied by selective application of said display pulses to said electrodes forming said dot matrix;

means for applying read pulses to said first set of electrodes; and means for sensing pulses transmitted capacitively from said first set of electrodes via the conductive layer to said third electrode means.

15. A combined switch and display unit as claimed in claim 14 in which said means for providing display pulses is operative both to apply display control pulses individually to each electrode in said first set of electrodes and also to apply read pulses simultaneously thereto.

16. A combined switch and display unit as claimed in claim 1, 4 or 14 in which said display medium is a layer of material which will produce a visual change in response to the electric field caused by said display pulses on said electrodes.

17. A combined switch and display assembly as claimed in claim 16, in which said display medium is a phosphor.

18. A combined switch and display assembly as claimed in claim 16, in which said display medium is a liquid crystal.

19. A combined switch and display assembly as claimed in claim 16, in which said display medium is an ionizable gas.

20. A combined switch and display assembly as claimed in claim 16, in which said display medium is an electro chromic material.

21. A combined switch and display assembly as claimed in claim 16, in which said display medium is an electro phoretic material.

* * * * *